United States Patent
Erdogan et al.

(10) Patent No.: US 9,086,439 B2
(45) Date of Patent: Jul. 21, 2015

(54) CIRCUITS, DEVICES AND METHODS HAVING PIPELINED CAPACITANCE SENSING

(75) Inventors: Ozan E. Erdogan, Sunnyvale, CA (US);
Guozhong Shen, San Jose, CA (US);
Syed T. Mahmud, Dublin, CA (US);
Jean CauXuan Le, Santa Clara, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 547 days.

(21) Appl. No.: 13/403,885

(22) Filed: Feb. 23, 2012

(65) Prior Publication Data

US 2012/0217981 A1 Aug. 30, 2012

Related U.S. Application Data

(60) Provisional application No. 61/446,944, filed on Feb. 25, 2011.

(51) Int. Cl.
*G01R 27/26* (2006.01)
*G06F 3/041* (2006.01)
*G01D 5/24* (2006.01)

(52) U.S. Cl.
CPC .............. *G01R 27/2605* (2013.01); *G01D 5/24* (2013.01); *G06F 3/0416* (2013.01)

(58) Field of Classification Search
CPC .. G01R 27/2605; G11C 27/02; H03M 1/1245
See application file for complete search history.

(56) References Cited

U.S. PATENT DOCUMENTS

| | | | | |
|---|---|---|---|---|
| 7,206,062 | B2 * | 4/2007 | Asbrock et al. | 356/4.03 |
| 2007/0091053 | A1 * | 4/2007 | Kajiwara et al. | 345/100 |
| 2008/0297487 | A1 * | 12/2008 | Hotelling et al. | 345/173 |
| 2011/0001492 | A1 * | 1/2011 | Nys et al. | 324/658 |
| 2011/0018626 | A1 * | 1/2011 | Kojima | 329/306 |
| 2011/0095991 | A1 * | 4/2011 | Philipp et al. | 345/173 |
| 2011/0273189 | A1 * | 11/2011 | Gerber | 324/658 |

\* cited by examiner

*Primary Examiner* — Arleen M Vazquez
*Assistant Examiner* — Feba Pothen
(74) *Attorney, Agent, or Firm* — Advent, LLP (57) ABSTRACT

Capacitance sensing circuits, systems and method can include sample and hold (S/H) circuits that can retain analog values for one set of capacitance sensors, and sequentially convert such analog values into digital values while analog values for another set of capacitance sensors values are generated.

17 Claims, 10 Drawing Sheets

FIG. 17A
(BACKGROUND)

FIG. 17B
(BACKGROUND)

US 9,086,439 B2

CIRCUITS, DEVICES AND METHODS HAVING PIPELINED CAPACITANCE SENSING

This application claims the benefit of U.S. Provisional Patent Application Ser. No. 61/446,944 filed on Feb. 25, 2011, the contents of which are incorporated by reference herein.

TECHNICAL FIELD

The present disclosure relates generally to capacitance sensing circuits, and more particularly to capacitance sensing circuits that can pipeline sense operations for groups of capacitance sensors.

BACKGROUND

Figure 17A:
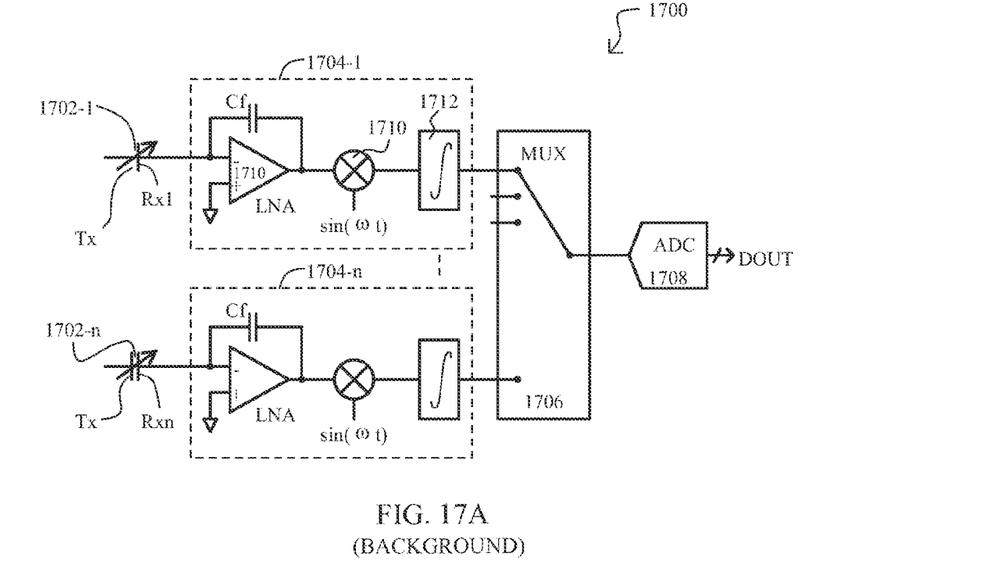
FIGS. 17A and 17B are a block schematic diagram and timing diagram of a capacitance sensing system.

Referring to FIG. 17A, a capacitance sensing system 1700 is shown. Capacitance sensing system 1700 includes capacitance elements 1702-1 to -n, sense channels 1704-1 to -n, a multiplexer (MUX) 1706, and an analog-to-digital converter (ADC) 1708. Capacitance elements (1702-1 to -n) are formed by a mutual capacitance between a transmit electrode (Tx) and receive electrodes (Rx1 to Rxn). Such a capacitance can vary in response to an object touching, or being proximate to, a surface containing the electrodes. Sense channels (1704-1 to -n) each include a low noise amplifier (LNA) (one shown as 1708), a mixer (one shown as 1710), and an integrator (one shown as 1712). Each sense channel (1704-1 to -n) generates a voltage corresponding to a sensed capacitance. A MUX 1706 sequentially connects an output of each sense channel (1704-1 to -n) to ADC 1708. ADC 1708 converts analog outputs from integrators (e.g., 1710) into digital output values DOUT.

Figure 17B:
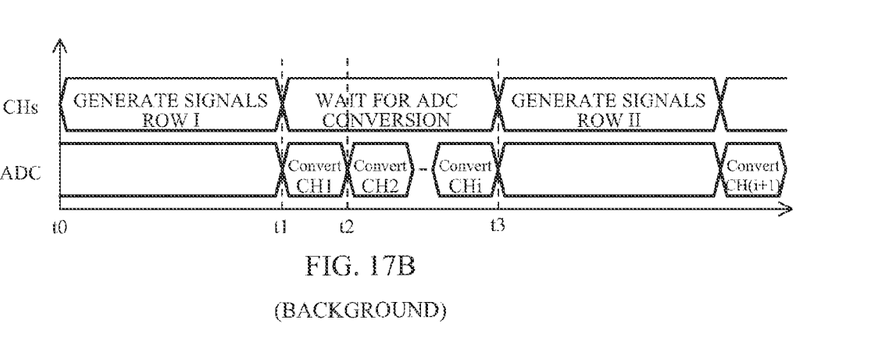

Referring to FIG. 17B, a capacitance sensing operation for system 1700 is shown in a timing diagram. Waveform CHs shows operations of sense channels in a system. Waveform ADC shows an operation of an ADC 1708.

At about time t0, signals can be generated corresponding to the Rx electrodes.

At about time t1, once sufficient time has passed for sense channels (1704-1 to -n) to acquire analog values, a MUX 1706 starts to sequentially connect each channel to the ADC 1708. The analog value from channel CH1 (1704-0) is the first value converted by ADC 1708. One-by-one, each channel is connected to the ADC 1708, and the analog value generated by the sense channel is converted into a digital value.

At time t2, MUX 1706 can switch a next channel to ADC 1708, which can generate a digital value for a next channel of the row (in this case channel CH2). This can continue until all channels of ROW I are sensed.

At about time t3, signals can be generated corresponding to a next row (ROW II) of Rx electrodes. Sensing can continue for the next row in the same fashion.

As understood from above, in the approach shown, generating signals for one row (i.e., ROW II) does not start until the ADC 1708 has finished converting values for a previous row (i.e., ROW I).

DETAILED DESCRIPTION

Various embodiments will now be described in detail with reference to a number of drawings. The embodiments show circuits, systems, and methods for sensing a capacitance of multiple elements in which values for one set of elements are sampled and held for conversion into digital values, while sensing signals are generated for a next group of sense elements. In this way, capacitance sensing of different element groups can be "pipelined".

Figure 1:
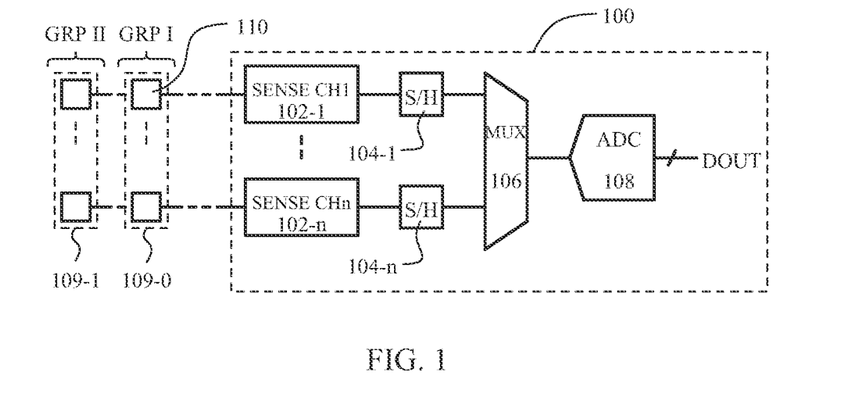
FIG. 1 is a block schematic diagram of a capacitance sensing circuit according to one embodiment.

Referring to FIG. 1, a capacitance sensing circuit according to a first embodiment is shown in a block diagram and designated by the general reference character 100. A circuit 100 can include a number of sense channels 102-1 to -n, sample-and-hold (S/H) circuits 104-1 to -n, a multiplexer (MUX) circuit 106, and an analog-to-digital converter (ADC) 108. In one embodiment, the number of sample-and-hold (S/H) circuits 104-1 to -n can be the same as the number sense channels 102-0 to -n. A circuit 100 can output a series of digital values (DOUT) corresponding to a sensed capacitance for a group of capacitance sensors (one shown as 110). In the particular embodiment shown, a circuit 100 can be connected to different capacitance sensor groups (e.g., GRP I 109-0, GRP II 109-1) at separate times. While two capacitance sensor groups are shown (109-0/1), it is understood that embodiments can cycle through numerous groups of capacitance sensors.

Each sense channel 102-1 to -n can generate a sense value for a corresponding capacitance sensor (e.g., 110). In some embodiments, each sense channel (102-1 to -n) can amplify a signal generated on a corresponding sensor (e.g., 110). More particularly, each sense channel (102-1 to -n) can amplify a signal driven on a capacitance sensor via mutual capacitive coupling. However, in other embodiments, capacitance sensor can measure a capacitance without a driving signal (e.g., each channel can sense a self-capacitance of a capacitance sensor).

Each S/H circuit (104-1 to -n) can sample an analog value output from a corresponding sense channel (102-1 to -n), and store such a value for conversion by an ADC 108. It is noted that once a value is held within a S/H circuit (104-1 to -n), a corresponding sense channel (102-1 to -n) can begin sensing a new capacitance value. In a particular embodiment, S/H circuits (104-1 to -n) can sample values from corresponding sense channels (102-1 to -n) substantially simultaneously. Such a capability can enable the sensing of a next group of capacitance values while previously sampled values are converted into digital values.

In some embodiments, each S/H circuit (104-1 to -n) can have a wait mode that different from a sample mode or a hold mode. In a sample mode, a S/H circuit (104-1 to -n) can receive a sense value (e.g., a voltage) from a corresponding sense channel (102-1 to -n). In a hold mode, a S/H circuit (104-1 to -n) can hold the sense value for conversion by ADC 108. In contrast, in a wait mode, a S/H circuit (104-1 to -n) can hold the sense value, isolating it from both the ADC 180 and the corresponding sense channel (102-1 to -n). In some embodiments, each S/H circuit (104-1 to -n) can include active circuit elements that can be switched between different power consuming configurations based on mode of operation (e.g., sample, wait, hold). In one embodiment, active circuit elements within each S/H circuit (104-1 to -n) can be in a low/no power consuming state in the sample and wait modes, in which such active circuits elements are non-operational. However, in the hold mode, such active elements can be switched to an operational state, consuming more power than in the low/no power consuming state.

A MUX 106 can be a switching circuit or group of switching circuits that can selectively connect each S/H circuit (104-1 to -n) to an input of ADC 108. Each S/H circuit (104-1 to -n) can store its sampled value until it has been output to ADC 108. A MUX 106 can thus connect individual sampled values to ADC 108 in a predetermined sequence to enable conversion of such values from analog to digital form.

ADC 108 can convert analog values received from MUX 108 into digital values. An ADC 108 can take the form of any suitable ADC, including but not limited to a "flash" ADC, sigma-delta (modulating) ADC, successive approximation register (SAR) type ADC, or an integrating ADC, as but a few examples. It is noted that embodiments include fewer ADCs than sense channels. In the embodiment shown, there can be one ADC for a group of sense channels.

As noted above, sampling and holding of analog values can enable a sense channels to operate on a next set of capacitance measurements while a previous set is being converted. Such an operation is shown in FIG. 2, and can be one type of operation executed by the embodiment shown in FIG. 1.

Figure 2:
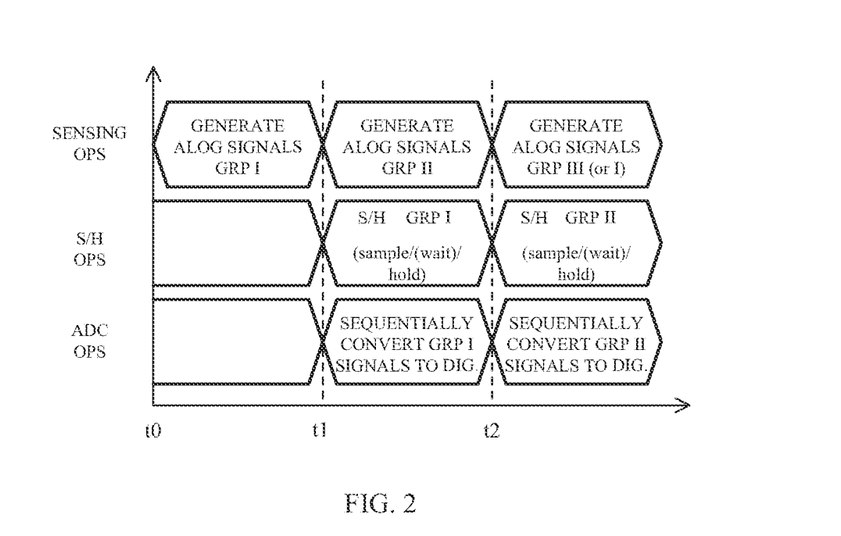
FIG. 2 is a timing diagram showing operations of a circuit like that of FIG. 1 according to an embodiment.

Referring to FIG. 2, an example of a capacitance sensing operation according to an embodiment is shown in a timing diagram. FIG. 2 includes the following waveforms: SENSING OPS showing the operations of sense channels; S/H OPS shows the operations of S/H circuits, and ADC OPS show the operations of an ADC.

At about time t0, as shown in by SENSING OPS, analog signals can be generated for a first group (GRP I) of capacitance sensors on a set of sense channels. As in the embodiment above, such an action can include a mutual capacitance sensing approach in which a transmit signal is capacitively coupled to capacitance sensors and then amplified. Alternatively, such an action can include a self-capacitance sensing approach in which each sense channel applies signals to a corresponding capacitance sensor to sense a capacitance of the sensor (e.g., with respect to a reference potential, such as ground).

At about time t1, as shown by S/H OPS, GRP I analog values (that each represent a sensed capacitance) can be sampled, some maintained in a wait state, and then held conversion by and ADC. ADC OPS shows the conversion of such held values into digital values by ADC. Also at time t1, because GRP I values are held (or waiting) by S/H circuits independent of sense channels, as shown by waveform SENSING OPS, sense channels can start sensing a capacitance of a next group of analog signals (GRP II), rather than wait for conversion of the first group to be complete. This is in sharp contrast to approaches like that of FIG. 17B, in which a sensing of a second group does not start until conversion of the first group is complete.

At about time t2, the above-described operations can continue in a "pipelined" fashion to provide continuous groups of held (or waiting) analog values to an ADC, while new analog values are generated for other groups. Waveform SENSING OPS shows how sensing can continue on to a next group (GRP III), or can return to a previously sensed group (GRP I), depending upon the number of capacitance sensor groups being sensed.

The description above has described an operation in which successive sensing operations are performed by a same set of sense channels. However, alternate embodiments can switch between sense channel sets. Such an embodiment is represented in FIG. 3.

Figure 3:
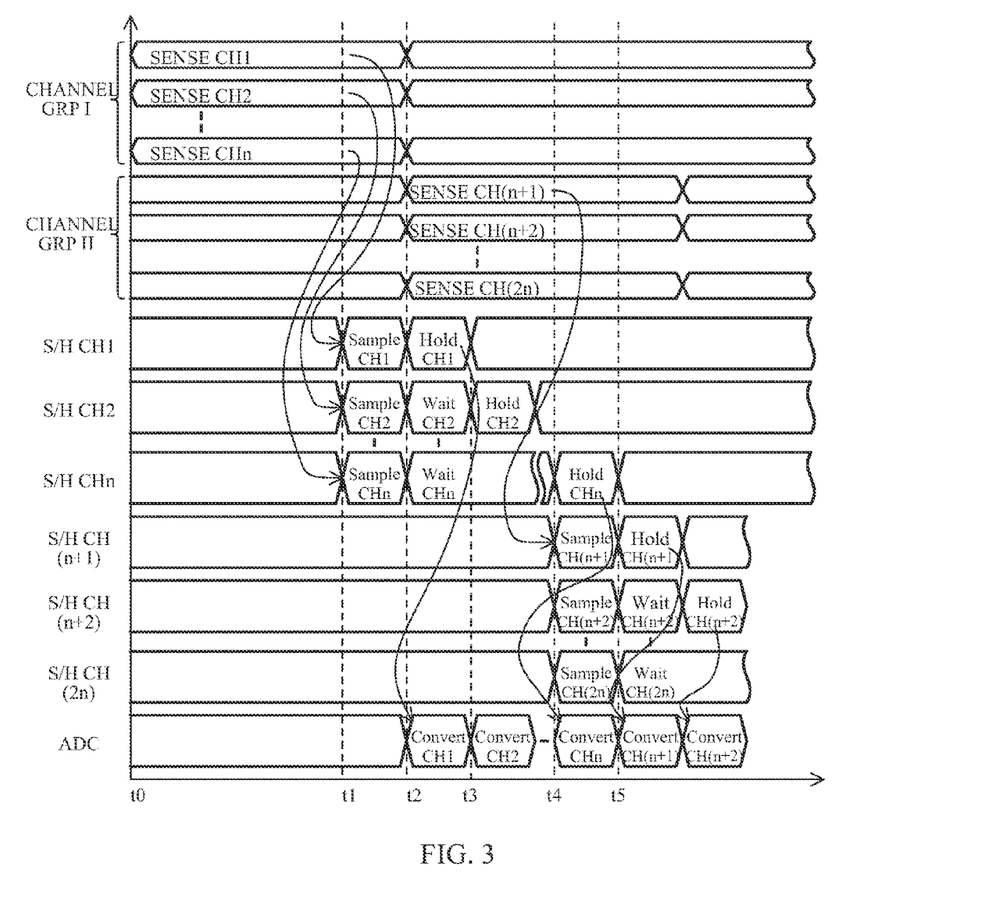
FIG. 3 is a timing diagram showing operations of a capacitance sensing circuit according to another embodiment.

Referring to FIG. 3, an example of a capacitance measuring operation according to another embodiment is shown in a timing diagram. FIG. 3 includes the following waveforms: CHANNEL GRP I, showing sense operations for a first group of sense channels (CH1 to CHn); CHANNEL GRP II, showing sense operations for a second group of sense channels (CH(n+1) to CH(2n)), S/H CH1 to S/H (2n) show operations of sample and hold circuits; and ADC, showing the operation of an ADC.

At about time t0, a first group of sense channels (SENSE CH1 to CHn) can begin acquiring values from capacitance sensors.

At about time t1, S/H circuits (S/H CH1 to CHn) corresponding to the first group of sense channels can sample analog values provided by such sense channels.

At about time t2, an analog value for one channel (in the example shown, CH1) can be held for conversion by an ADC. In some embodiments, remaining channels (i.e., CH2 to CHn) can be in wait states, retaining their analog values until the analog values are sequentially converted into digital values by the ADC. While such values are waiting or held and converted, a second group of sense channels (SENSE CH(n+1) to CH(2n)) can begin acquiring values from another set of capacitance sensors.

In the particular embodiment shown, at about time t3, an analog-to-digital conversion for S/H CH1 can be complete, and S/H CH2 can hold its analog value for conversion. At the same time, remaining channels (e.g., CH3 to CHn) remain in a wait state, awaiting conversion of their analog values.

At about time t4, S/H circuits (S/H CH(n+1) to CH(2n)) corresponding to the second group of sense channels can sample analog values provided by their corresponding such sense channels. In the embodiment shown, also at this time, a last channel (CHn) from a previous group can hold its analog value for conversion by an ADC.

At about time t5, an analog value for one channel (in the example shown, CH(n+1)) can be held for conversion by an ADC. In some embodiments, remaining channels (i.e., CH(n+2) to CH(2n)) can be in wait states, retaining their analog values for subsequent conversion into digital values by the ADC.

In an embodiment like that of FIG. 3, a larger multiplexer can switch different sets of S/H circuits to a same ADC.

Figure 4:
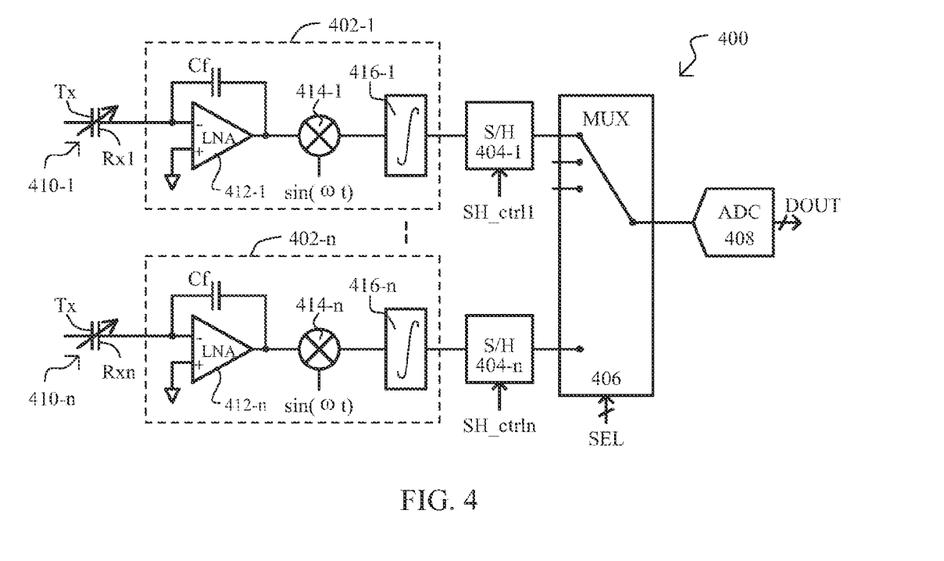
FIG. 4 is a block schematic diagram of a capacitance sensing circuit according to a further embodiment.

Referring now to FIG. 4, a capacitance sensing circuit according to another particular embodiment is shown in block schematic diagram and designated by the general reference character 400. A circuit 400 can include sense channels 402-1 to -n, S/H circuits 404-1 to -n (one corresponding to each sense channel (402-1 to -n)), a MUX 406, and an ADC 408. Each sense channel (402-1 to -n) can sense a capacitance of one or more capacitance elements (one set shown as 410-1 to -n). In the particular embodiment shown, each capacitance element (e.g., 410-0 to -n) can be formed by a mutual capacitance between a transmit electrode (Tx) and receive electrodes (Rx1 to Rxn). A capacitance of each element (e.g., 410-0 to -n) can vary in response to the proximity of an object to an electrode.

In some embodiments, a transmit electrode (Tx) can be driven by a periodic transmit signal to induce a periodic sense signal on receive electrodes (Rx1 to Rxn).

In the embodiment of FIG. 4, each sense channel (402-1 to -n) can include a low noise amplifier (LNA) (412-1 to -n), a mixer circuit (414-1 to -n), and an integrator circuit (416-1 to -n). Each LNA (412-1 to -n) can include a feedback capacitor Cf coupled between an inverting input (−) and an output. An inverting input (−) can also be connected to a capacitance element (410-1 to -n) being sensed. A non-inverting input (+) can be connected to a reference voltage, which in this embodiment can be ground. In a particular embodiment, each LNA (412-1 to -n) can amplify a period signal induced on its corresponding input by a transmit signal.

A mixer circuit (414-1 to -n) can mix a reference signal with a capacitance sense output signal provided by a corresponding LNA (412-1 to -n). A resulting output signal from a mixer circuit (414-1 to -n) can be provided to an integrator circuit (416-1 to -n). In the embodiment shown, a mixing signal can be a periodic signal $\sin(\omega t)$. In one particular embodiment, a transmit electrode Tx can be driven with a drive signal that is periodic, and a frequency of $\sin(\omega t)$ the reference signal can be selected to pass a desired portion of an output from the corresponding LNA (412-1 to -n) to integrator circuit (416-1 to -n). An integrator circuit (416-1 to -n) can integrate a periodic signal output from a mixer circuit (414-1 to -n) to generate an analog voltage corresponding to such a signal. While integrator circuits (416-1 to -n) can be inverting integrator circuits in some embodiments, in alternate embodiments integrator circuits (416-1 to -n) can be non-inverting integrator circuits.

Each S/H circuit (404-1 to -n) can sample an analog voltage output from a corresponding integrator (e.g., 416) and hold such a value for output to MUX 406. In some embodiment, some or all of S/H circuits (404-1 to -n) can have sample, wait and hold modes, like those described above, or equivalents. In addition or alternatively, S/H circuits (404-1 to -n) can be placed into a low/no power consuming state in the sample and wait modes, and switch to an operational state in the hold mode, as described above, or an equivalent. In the embodiment shown, S/H circuits (404-1 to -n) can be controlled according to control signals SH_ctrl1 to SH_ctrln. In one embodiment, controls signals (SH_ctrl1 to SH_ctrln) can enable S/H circuits (404-1 to -n) to be placed in a sample mode substantially simultaneously, thus, analog capacitance values can be sampled at substantially the same time. Controls signals (SH_ctrl1 to SH_ctrln) can also enable S/H circuits (404-1 to -n) to be placed in a hold mode sequentially. In particular embodiments, controls signals (SH_ctrl1 to SH_ctrln) can place S/H circuits (404-1 to -n) into a wait mode between a sample mode and a hold mode.

MUX 406 can sequentially connect individual S/H circuits (404-1 to -n) to ADC 408 in response to select signals SEL. An ADC 408 can be any suitable ADC circuit, and can take various forms, including those noted with respect to ADC 108 in FIG. 1, or equivalents.

Having described various portions of a capacitance sensing circuit with reference to FIG. 4, an operation of such a circuit according to a particular embodiment will now be described with reference to FIG. 5.

Figure 5:
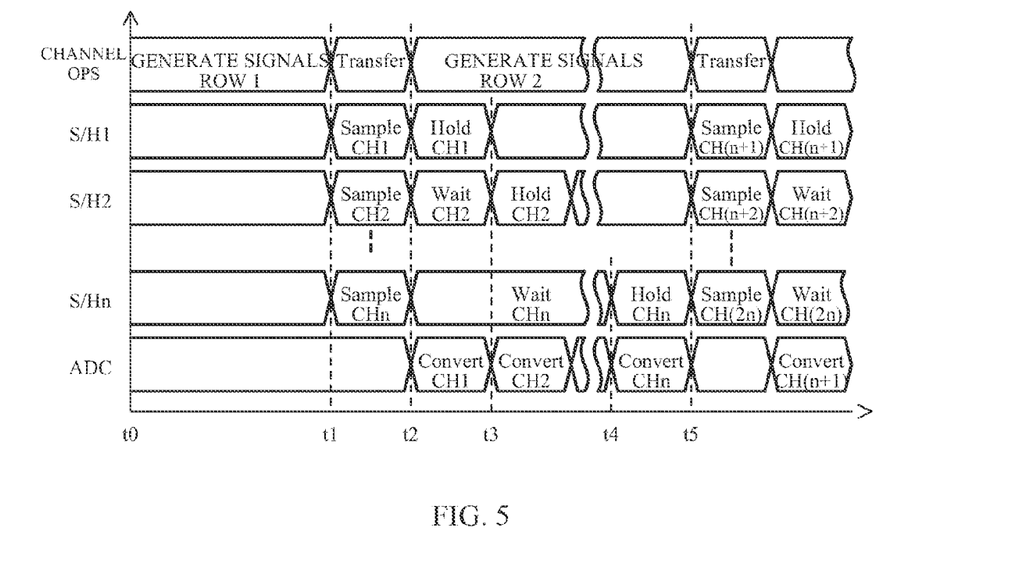
FIG. 5 is a timing diagram showing operations of a circuit like that of FIG. 4 according to an embodiment.

Referring now to FIG. 5, an operation of a capacitance sensing operation according to one particular embodiment is shown in a timing diagram. FIG. 5 includes the following waveforms: CHANNEL OPS showing the operations of sense channels (e.g., 402-1 to -n); S/H1 to S/Hn, showing the operations of S/H circuits (e.g., 404-1 to 404-n), respectively; and ADC showing the operations of an ADC (e.g., 408).

At about time t0, sense channels (e.g., 402-1 to -n) can start to generate analog signals for a first row (ROW 1). Such actions can include driving a transmit electrode (Tx) with a periodic signal to generate, via mutual capacitance, a coupled signal on receive electrodes (Rx1 to Rxn). Such a coupling capacitance can vary according whether or not an object is in proximity to the electrodes (e.g., a touch has occurred). Within each sense channel (e.g., 402-1 to -n), a signal coupled by such mutual capacitance can be amplified by an LNA (e.g., 412-1 to -n), and then gated by a mixer circuit (e.g., 414-1 to -n) to integrator circuits (e.g., 416-1 to -n) to generate an output voltage representative of the mutual capacitance.

At about time t1, control signals (e.g., SH_ctrl1 to SH_ctrln) can enable S/H circuits (e.g., 404-1 to -n) to enter sample modes of operation, resulting in analog signals from sense channels (402-1 to -n) to be transferred (Transfer) to S/H circuits (e.g., 404-1 to -n). S/H circuits (e.g., 404-1 to -n) can retain such sampled values (Sample CH1, Sample CH2, etc.), thus capturing capacitance measurements for a row (ROW 1).

At about time t2, sense channels (e.g., 402-1 to -n) can start to generate analog signals for a second row (ROW 2). At about the same time, a first S/H circuit (in this case S/H1) can hold its sampled value for transfer through a MUX (e.g., 406) to an ADC (e.g., 408). Other S/H circuits (in this case S/H2 to SHn) can be placed into wait states, retaining their sampled values. In addition, SEL signals can enable a MUX (e.g., 406) to couple a sampled value for S/H1 to ADC (e.g., 408). ADC (e.g., 408) can convert the analog value held by S/H1 into a digital value (shown as "Convert CH1").

At about time t3, a next S/H circuit (in this case S/H2) can hold its sampled value for transfer through a MUX (e.g., 406). A next set of SEL signals can cause a MUX (e.g., 406) to couple the analog value of S/H2 to an ADC (e.g., 408). An ADC (e.g., 408) can then convert this analog value into a digital value (shown as "Convert CH2"). Such actions can continue with each S/H circuit.

At about time t4, a last S/H circuit in a sequence (in this case S/Hn) can hold its sampled value for transfer through a MUX (e.g., 406) for conversion by ADC (e.g., 408) as described above.

At about time t5, a control signals (e.g., SH_ctrl1 to SH_ctrln) can once again enable S/H circuits (e.g., 404-1 to -n) to sample analog values output from each sense channel (e.g., 402-1 to -n), thus capturing capacitance values for a next (ROW 2). Such values can be held and converted in the same fashion as described above for the previous row (ROW 1).

Such an operation is in sharp contrast to an approach like that shown in FIG. 17B, in which generation of a second row of signals does not start until conversions of the previous row have been completed (i.e., at time t5, rather than t2).

Referring now to FIGS. 6A to 6D, a S/H circuit 604 according to a particular embodiment will now be described. In very particular embodiments, a S/H circuit 604 can form all or part of the S/H circuits referred to in any of FIGS. 1-5.

FIGS. 6A to 6D show an integrator circuit 616 and a corresponding S/H circuit 604. An integrator circuit 616 can receive an input signal Sig_in that varies according to a sensed capacitance. Integrator circuit 616 can integrate input signal Sig_in to generate an input voltage Vin.

A S/H circuit 604 can include a sample capacitor 662, an amplifier 664 and switch elements 660-0 to -3. A sample capacitor 662 can store a sampled value that can be retained in a wait mode, and amplified in a hold mode.

Switch element 660-0 can selectively connect an input voltage (Vin) generated by integrator circuit 616 to a first terminal of sample capacitor 662 in response to switch signal S0. Switch element 660-1 can selectively connect a first terminal of sample capacitor 662 to a reference voltage (in this embodiment ground) in response to switch signal S1. Switch element 660-2 can selectively a second terminal of sample capacitor 662 to a reference voltage in response to switch signal S2. Switch element 660-3 can selectively connect a first terminal of sample capacitor 662 to a feedback loop for amplifier 664 in response to switch signal /S2.

An amplifier 664 can be an operational amplifier having an inverting input (−) connected to a second terminal of sample capacitor 662, a non-inverting input (+) connected to a reference voltage (in the embodiment shown ground) and an output that provides an output voltage. An amplifier 664 can be switched between at least an active an inactive mode in response to an amplifier enable signal amp_en. In an active mode, an amplifier 664 can amplifier a voltage between its inputs to generate an output voltage Vout. In an inactive mode, an amplifier 664 can provide no amplification, and can consume substantially less power than in the active mode.

Figure 6A:
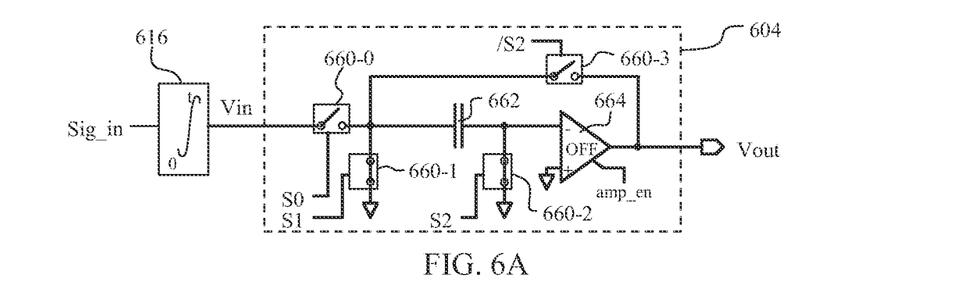
FIGS. 6A to 6D are a sequence of block schematic diagrams showing a sample and hold circuit and modes of operation according to embodiments.

FIG. 6A shows a S/H circuit 604 in an idle mode. In one embodiment, a S/H circuit 604 can be placed in an idle mode prior to a sample mode and/or after a hold mode. In an idle mode, a sample capacitor 662 can be discharged of a previously sampled input voltage. In the embodiment shown, in an idle mode, switch element 660-0 can be open (i.e., high impedance), isolating sample capacitor 662 from input voltage Vin. Switch element 660-3 can also be open, isolating sample capacitor 662 from a feedback loop of amplifier 664. Switch elements 660-1 and 660-2 can be closed (i.e., low impedance), connecting first and second terminals of sample capacitor 662 to ground, which can discharge the sample capacitor 662. An amplifier 664 can be inactive in the idle mode.

Figure 6B:
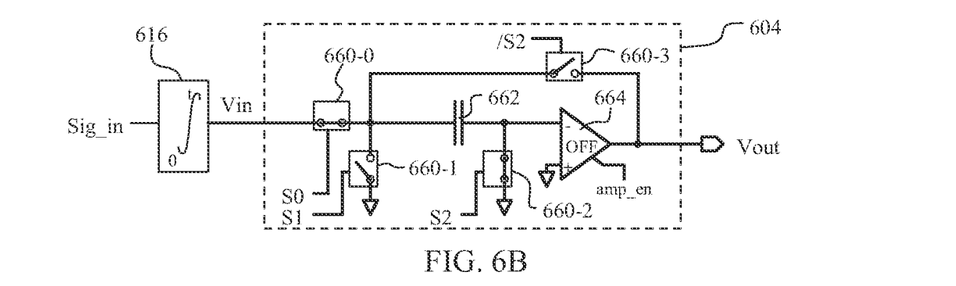

FIG. 6B shows a S/H circuit 604 in a sample mode. In a sample mode, a sample capacitor 662 can receive an input voltage Vin representing a sampled capacitance. In the embodiment shown, in a sample mode, switch element 660-0 can be closed while switch elements 660-1 and 660-3 are open, connecting a first terminal of sample capacitor 662 to input voltage Vin. Switch element 660-2 can be closed, connecting second terminal 662 to a reference voltage (e.g., ground). Thus a sample capacitor 662 can be charged based on a difference between Vin and the reference voltage. An amplifier 664 can be inactive in the idle mode.

Figure 6C:
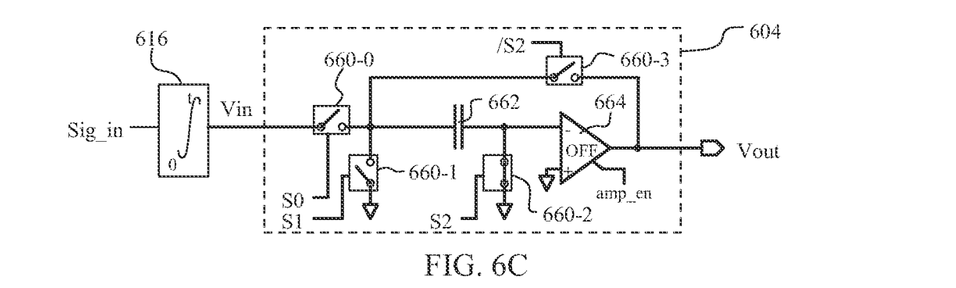

FIG. 6C shows a S/H circuit 604 in a wait mode. In a wait mode, a sample capacitor 662 can retain a voltage acquired from input voltage Vin, which represents a sampled capacitance. In the embodiment shown, in a wait mode, switch elements 660-0, 660-1 and 660-3 can all be open, electrically isolating a first terminal of sample capacitor 662. Switch element 660-2 can be closed, connecting second terminal 662 to a reference voltage (e.g., ground). An amplifier 664 can be inactive in the wait mode.

Figure 6D:
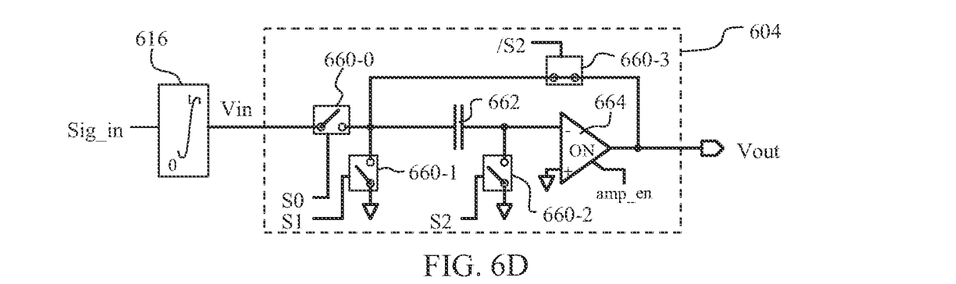

FIG. 6D shows a S/H circuit 604 in a hold mode. In a hold mode, a voltage on sample capacitor 662 can be amplified by amplifier 662 to generate an output voltage Vout. In the embodiment shown, in a hold mode, switch elements 660-0, 660-1 and 660-2 can all be open, while switch element 660-3 can be closed. An amplifier 664 can be active in the hold mode, generating an output voltage Vout based on a voltage across sample capacitor 662.

In a particular embodiment, a S/H circuit 604 can transition from an idle mode, to a sample mode, to a wait mode, to a hold mode, and then repeat the sequence. As understood from the description above, an amplifier (e.g., 664) can be inactive in the idle, sample and wait modes, thus conserving power.

It is understood that while in some embodiments a S/H circuit can provide a unity gain response, in other embodiments, a S/H circuit can provide a gain greater than one.

Figure 7:
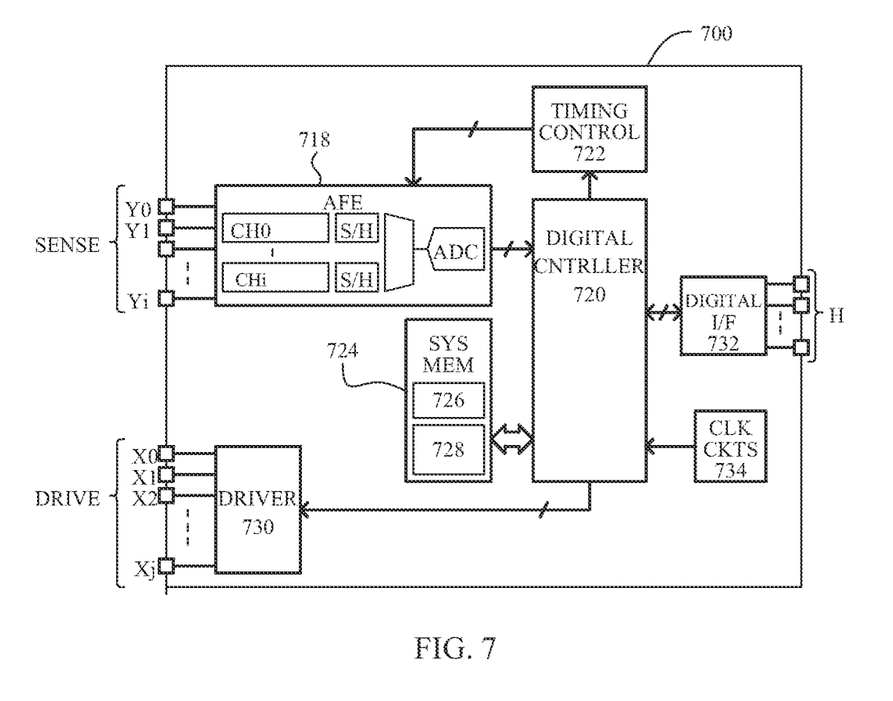
FIG. 7 is a block schematic diagram of a capacitance sensing device according to an embodiment.

Referring now to FIG. 7, a device according to another embodiment is shown in a block schematic diagram and designated by the general reference character 700. In one embodiment, a device 700 can be a capacitance sense controller realized on a single integrated circuit substrate. Device 700 can include an analog front end (AFE) 718, a digital controller 720, a timing control circuit 722, a system memory section 724, a driver circuit 730, a digital interface (I/F) 732, and clock circuits 734.

An AFE 718 can include various analog circuit components, including capacitance sensing circuits such as those described in any of FIGS. 1 to 6D, or equivalents. An AFE 718 can have sense channels, or the like, connected to capacitance sense inputs (Y0 to Yi). An AFE 718 can provide digital values to a digital controller 720 corresponding to capacitance measurements taken on capacitance sense inputs (Y0 to Yi). In one very particular embodiment, capacitance sense inputs (Y0 to Yi) can be physical connections (e.g., pins, pads, leads, solder balls) of an integrated circuit device.

A digital controller 720 can control operations of device 700, including utilizing capacitance sense results to detect input events based on single or multiples touches (including fingers, stylus or other objects), gestures, proximity of objects to surface, and other equivalent methods. In one embodiment, a digital controller 720 can include one or more processors for executing instructions stored in a system memory 724. A digital controller 720 can provide control signals to timing and control circuit 722. Timing and control circuit 722 can generate control signals for operating AFE 718, including those that can control S/H circuits, transfer of analog values to an ADC, and operation of an ADC, as but a few examples.

A system memory 724 can include memory for use by a digital controller, including instructions for execution by a processor or the like, as well as system operation memory for storing digital capacitance sense values and/or calculations based upon such values. In the particular embodiment shown, a system memory 724 can include nonvolatile memory 726 and volatile memory 728. A nonvolatile memory 728 can store instructions or the like, and can include "flash" memory, or any other suitable nonvolatile memory technology. A volatile memory 728 can serve as a system operation memory and can include dynamic random access memory (DRAM), static RAM (SRAM), some combination thereof, or any other suitable memory.

A driver circuit 730 can drive outputs (X0 to Xj) with a driver signal in order to generate signals on sense inputs (Y0 to Yi), by way of a mutual capacitance sensing structure. In some embodiments, a driver signal can be driven on drive outputs (X0 to Xj) in a sequential fashion. In one very particular embodiment, drive outputs (X0 to Xj) can be physical connections (e.g., pins, pads, leads, solder balls) of an integrated circuit device.

In the embodiment shown, a device 700 can further include clock circuits 734 for providing timing signals to digital controller 720. Further, a digital I/F 732 can be included to enable a digital controller 720 to communicate with another device, such as a "host" device providing applications/functions in response to capacitance sense inputs.

Figure 8:
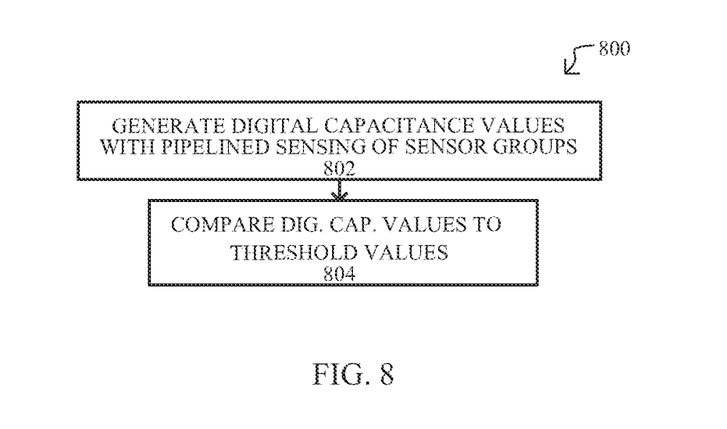
FIG. 8 is a flow diagram showing operations of a device like that of FIG. 7 according to an embodiment.

Referring now to FIG. 8, operations executed by a device 700 are shown in flow diagram 800. A device 700 can generate digital capacitance values with pipelined sensing of sensor groups (802). Such actions can include generating timing and control signals for AFE 718 to enable pipelined capacitance sensing as described herein, and equivalents. Digital capacitance values can be provided to digital controller 720.

Digital capacitance values can be compared to threshold values (804). Such an action can include comparing a digital capacitance values generated by AFE 718 to one or more threshold values. Such a comparison can determine the start of a sensed event (touch or proximity of one or more objects), as well as the termination of such an event (release of touch, lack of proximity). Threshold values can be generated based on a design, operating environment, calibration sequence, and other factors, and in particular embodiments, can be stored within system memory 724.

While embodiments can include circuits, and devices including such circuits, other embodiments can include capacitance sensing systems.

Figure 9:
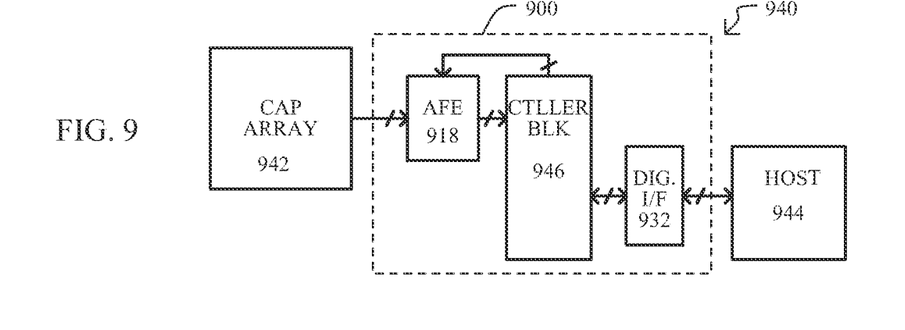
FIG. 9 is a block schematic diagram of a capacitance sensing system according to an embodiment.

Referring to FIG. 9, a system according to an embodiment is shown in block schematic diagram and designated by the general reference character 940. A system 940 can include a capacitance sensing device 900, a capacitance sense array 942, and a host device 944. A capacitance sensing device 900 can include an AFE 918, a controller block 946, and a digital I/F 932. An AFE 918 can take the form of that shown as 718 in FIG. 7, and equivalents. An AFE 918 can execute pipelined sensing of groups of capacitance sense elements as described herein, and equivalents. A controller block 946 can provide control signals for controlling the operation of AFE 918 to enable the generation of digital capacitance sense values. A controller block 946 can also generate capacitance sense results based on received digital capacitance sense values. In one particular embodiment, a controller block 946 can include a digital controller, system memory, timing control circuit, and clock circuits like those shown as 720, 724, 722, and 734 in FIG. 7, or an equivalent structure.

A digital I/F 932 can enable a controller block 946 to transmit capacitance sense results to a host device 944. A capacitance sense array 942 can present multiple groups of capacitance sense elements for pipeline sensing by AFE 918.

A host device 944 can perform higher level system functions in response to sense results received from controller block 946.

Figure 10:
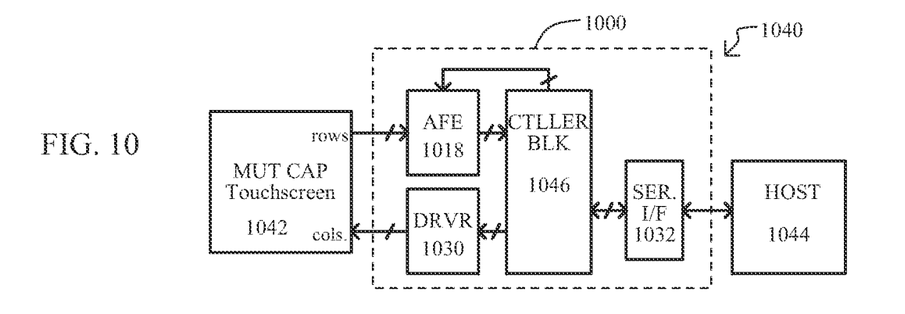
FIG. 10 is a block schematic diagram of a capacitance sensing system according to another embodiment.

Referring to FIG. 10, another system according to an embodiment is shown in block schematic diagram and designated by the general reference character 1040. A system 1040 can include sections like those of FIG. 9, and such like sections are referred to by the same reference character but with the first digit being "10" instead of a "9".

FIG. 10 differs from FIG. 9 in that a capacitance sensing device 1000 can be a mutual capacitance sensing device that includes a driver circuit 1030, which can be like that shown as 730 in FIG. 7, or an equivalent. A controller block 1046 can communicate with a host device 1044 via a serial interface 1032.

FIG. 10 also differs from FIG. 9 in that a capacitance sense array is shown to be a mutual capacitance touch screen 1042. Row electrodes of touch screen 1042 can be connected to AFE 1018, while column electrodes of touch screen 1042 can be connected to driver circuit 1030.

Embodiments like those shown in FIGS. 9 and/or 10 can provide faster scan times than ones that include a device like that shown in FIGS. 17A and 17B, as signals can be generated from one set of capacitance sensors while signals from a previous set of capacitance sensors are converted into digital values. Such scan times can result in better response times for a capacitance sense array 942/1042, as sensing over the entire array can occur more frequently.

Figure 11A:
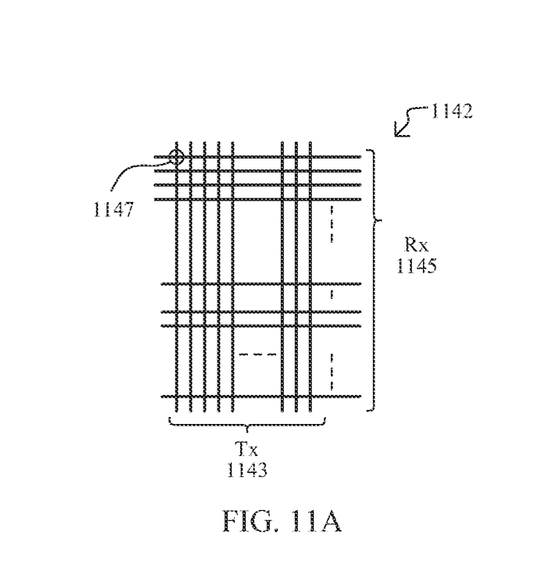
FIGS. 11A to 11C show capacitance sense arrays that can be included in embodiments.
Figure 11B:
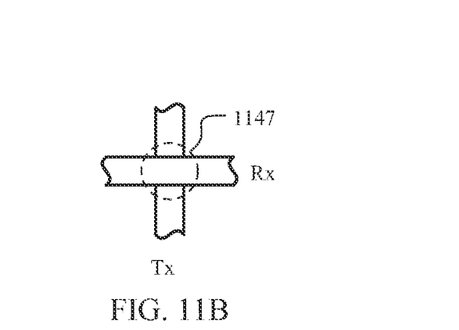
Figure 11C:
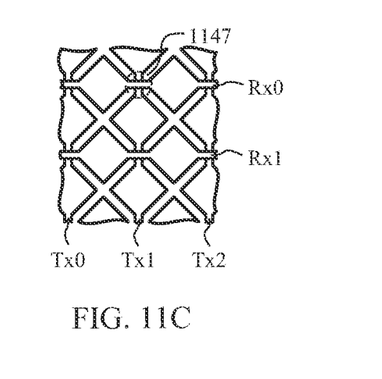

Referring to FIGS. 11A to 11C, examples of a mutual capacitance sense arrays that can be included in embodiments are shown in diagrams. FIG. 11A is a schematic diagram showing a capacitance sense array designated by the general reference character 1142. Array 1142 can be one example of touch screen shown as 1042 in FIG. 10. Array 1142 can include transmit electrodes (Tx) 1143 and receive electrodes (Rx) 1145. Each of transmit electrodes 1143 can intersect multiple receive electrodes 1145. One intersection point between a transmit and receive electrode is shown as 1147 in FIG. 11A. In operation, one of transmit electrodes (Tx) 1143 can be driven with a drive signal, while a capacitance on all receive electrodes (Rx) 1145 is sensed. In particular embodiments, electrodes (1143 and/or 1145) can be formed from a conductive, transparent material, such as indium tin oxide (ITO), as but one example.

FIG. 11B shows a first example of an intersection point like that shown as 1147 in FIG. 11A. FIG. 11B shows an arrangement in which a transmit electrode (Tx) can be formed below a receive electrode (Rx).

FIG. 11C shows a second example of an intersection point like that shown as 1147 in FIG. 11A. FIG. 11C shows an arrangement in which transmit electrodes (Tx0 to Tx2) can have larger portions (in this case diamond shape portions) that are coplanar with receive electrodes (Rx0, Rx1). The receive and transmit electrodes can overlap one another at narrowed portions.

Embodiments disclosed herein, and equivalents, can be realized in various types of touch screen controlled systems. Examples of such embodiments are shown in FIG. 12A to FIG. 12C.

Figure 12A:
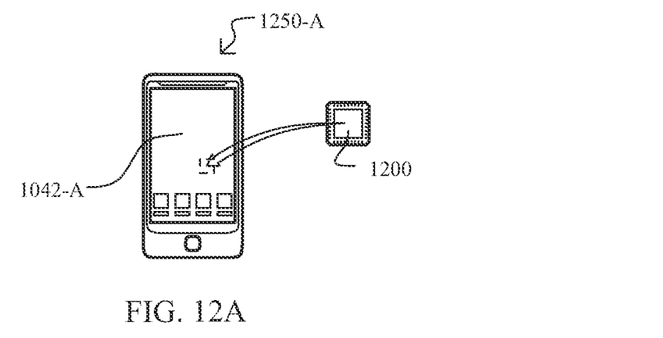
FIGS. 12A to 12C are diagrams showing touchscreen controlled systems according to some embodiments.

FIG. 12A is a plan view of a touch screen controlled smartphone device 1250-A. Such a device 1250-A can include a display screen 1042-A for controlling the device. Such a display screen 1042-A can include transparent electrodes formed over a screen. One or more capacitance sensing devices (one shown as 1200) can be included as an integrated circuit(s) within device 1250-A, and can enable pipelined capacitance sensing of touchscreen electrodes, as described herein, and equivalents. A capacitance sensing device 1200 can take the form of any of those shown herein, or an equivalent.

Figure 12B:
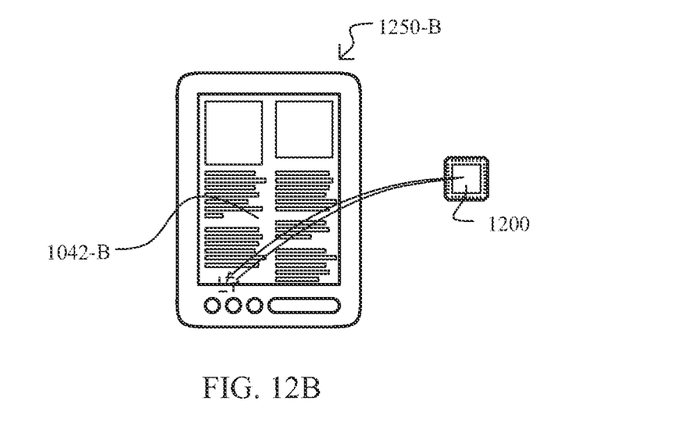

FIG. 12B is a plan view of a touch screen controlled "e-reader" device 1250-B. Such a device 1250-A can include a display screen 1042-B, at least a portion of which can provide for touch inputs from a user. One or more capacitance sensing devices (e.g., 1200) can be included as an integrated circuit within device 1250-B, as in the case of FIG. 12A.

Figure 12C:
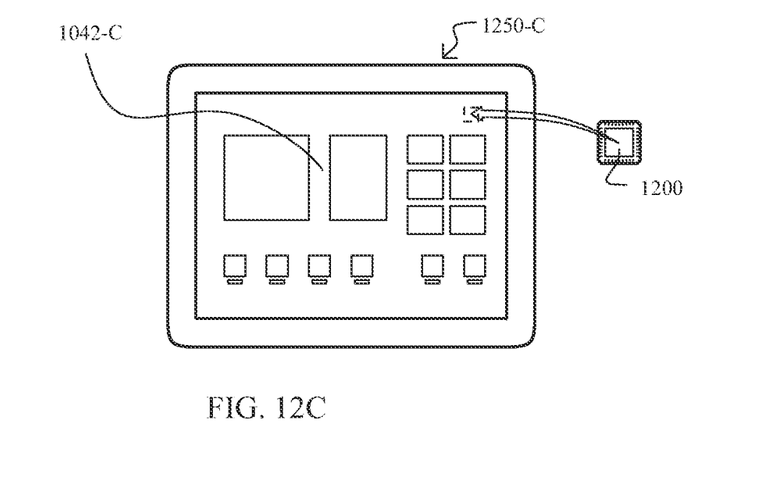

FIG. 12C is a plan view of a touch screen controlled tablet computing device 1250-C. Such a device 1250-C can include a touch screen 1042-C as a user input for the device. One or more capacitance sensing devices 1200 can be included as an integrated circuit within device 1250-C, as in the case of FIGS. 12A and 12B.

Various circuits, devices, systems and corresponding methods according to embodiments have been described above. Additional method embodiments will now be described in a series of flow diagrams.

Figure 13:
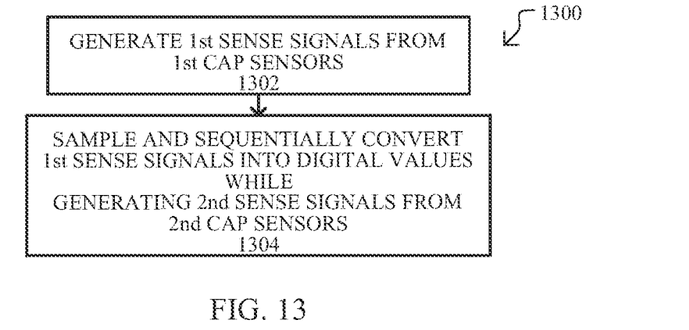
FIG. 13 is a flow diagram of a capacitance sensing method according to an embodiment.

Referring to FIG. 13, a capacitance sensing method according to an embodiment is shown in flow diagram and designated by the general reference character 1300. A method 1300 can include generating first sense signals from first capacitance sensors (1302). Such an action can include self-capacitance and/or mutual capacitance sensing techniques to generate a signal that varies in response to capacitance changes. First signals can then be sampled and sequentially converted into digital values while generating second sense signals from second capacitance sensors (1304). In some embodiments, such actions can include retaining sense signals in S/H circuits for sequential conversion by a same ADC. Such a method can enable the pipelining of signal generation and conversion of different sensor groups.

Figure 14:
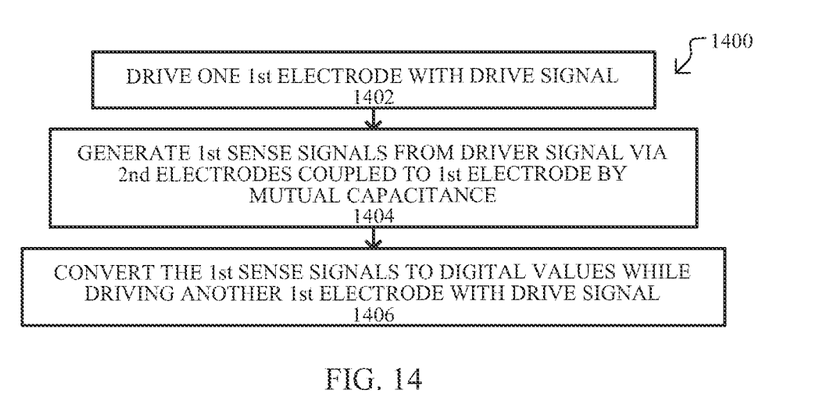
FIG. 14 is a flow diagram of a mutual capacitance sensing method according to an embodiment.
Figure 15:
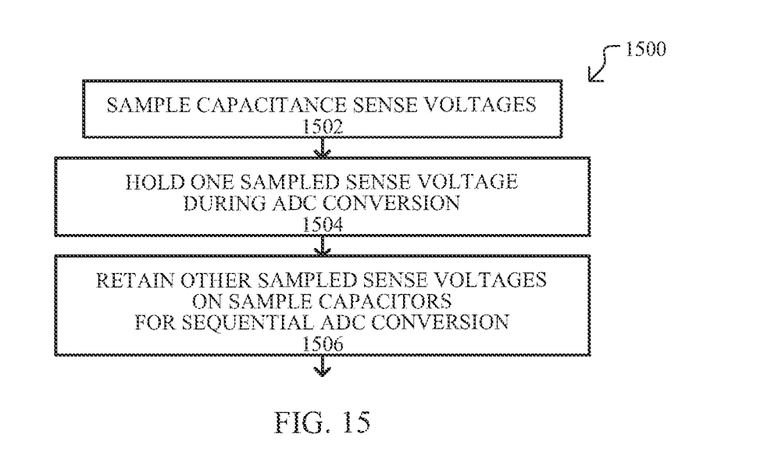
FIG. 15 is a flow diagram of a capacitance sensing method according to another embodiment.

Referring to FIG. 14, a capacitance sensing method according to a further embodiment is shown in flow diagram and designated by the general reference character 1400. A method 1400 can include driving one electrode with a drive signal (1402). In particular embodiments, such an action can include driving an electrode with a periodic signal. First signals can be generated from the driver signal by way of second electrodes that are coupled to the first electrode by a mutual capacitance (1404). A method 1400 can further include converting first sense signals into digital values, while driving another first electrode with the drive signal (1406). In particular embodiments, such an action can include converting all or a portion of first sense signals to sense values that are retained for subsequent conversion into digital values.

Figure 16:
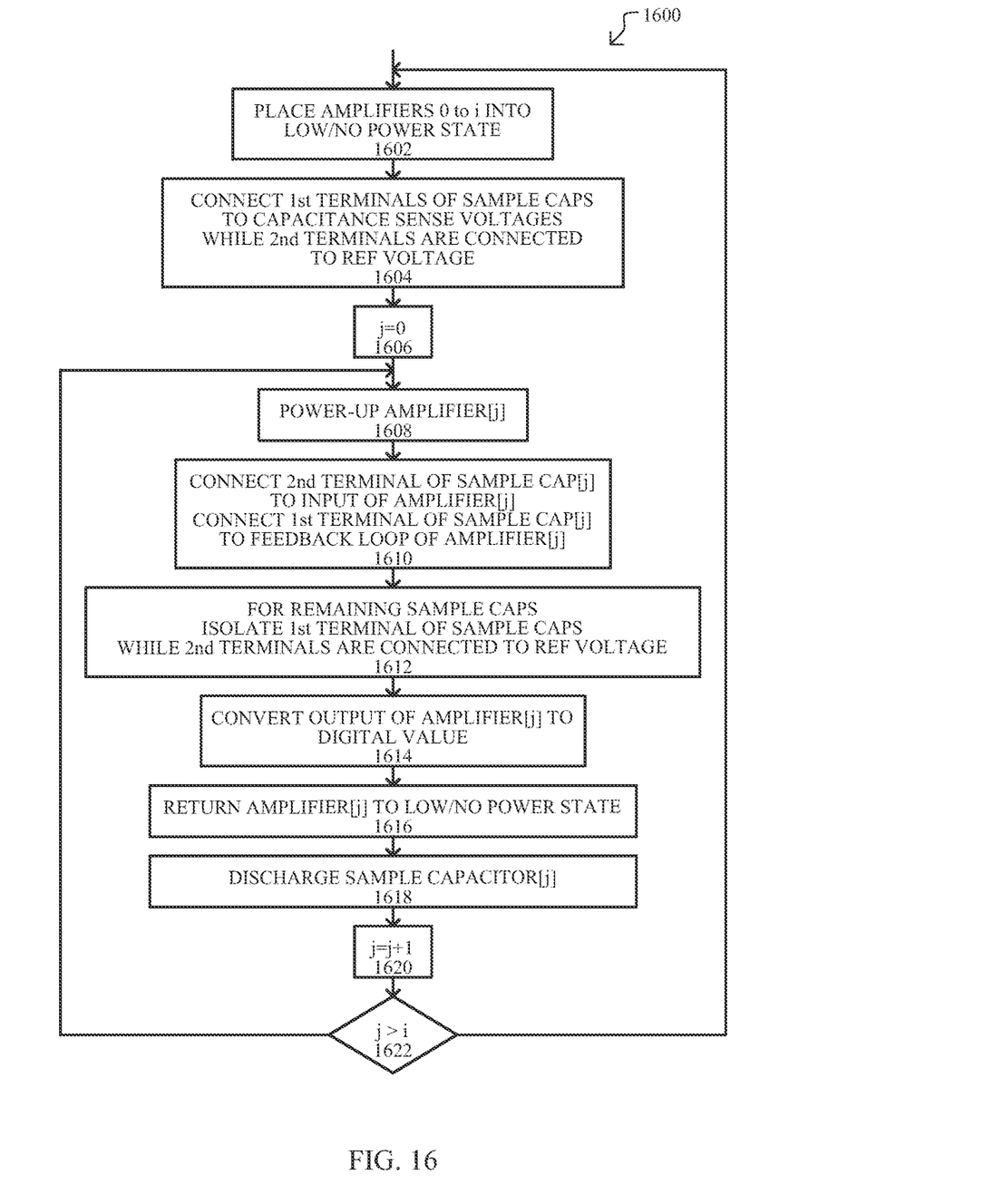
FIG. 16 is a flow diagram of a capacitance sensing method according to further embodiment.

Referring to FIG. 16, capacitance sensing operation according to an embodiment is shown in a flow diagram and designated by the general reference character 1600. A method 1600 can include placing amplifiers into a low/no power state (1602). In one embodiment, such an action can include placing amplifiers into an inactive state in which the amplifiers will not amplify a received input value.

A method 1600 can connect first terminals of sample capacitors to capacitance sense voltages while second terminals of the sample capacitors are connected to a reference voltage (1604). Such an action can charge (or discharge) sample capacitors based on receives sample voltages.

A channel selection value can be set to a first value (1606). In the particular embodiment shown, this can include setting a value "j" to zero.

A method 1600 can power-up an amplifier of the selected channel (1608). In one embodiment, such an action can include placing an amplifier of a selected channel into an active state in which the amplifier will amplify a voltage received at its input. A second terminal of a sample capacitor of the selected channel can be connected to an input of the amplifier of the selected channel. In addition, a first terminal of the sample capacitor of the selected channel can be connected to a feedback loop of the amplifier of the selected channel (1610). Such an action can connect a capacitance sense voltage of a first channel to its corresponding amplifier, enabling such a capacitance sense voltage to be amplified.

A method 1600 can also isolate first terminals of remaining sample capacitors while second terminals of sample capacitors are connected to a reference voltage. Such an action can retain a capacitance sense voltage on sampled capacitors for later amplification by a corresponding amplifier.

A method 1600 can convert an output of the selected amplifier into a digital value (1614). Thus, while a selected channel has its capacitance sense voltage converted into a digital value, sample capacitors in remaining channels can retain their capacitance sense voltages.

A method 1600 can further include returning an amplifier of the currently selected channel to the low/no power state (1616). A sample capacitor of the selected channel can be discharged (1618).

A channel selection value can be incremented (1620). Such an action can select a next channel in a sequence of channels.

A method 1600 can check to see if a last channel has been reached (1622). If a last channel has been reached (y from 1622) a method 1600 can return to action 1602. If a last channel has not been reached (n from 1622), a method 1600 can repeat actions 1608 to 1618 on the newly selected channel.

Embodiments of the invention can perform analog-to-digital conversion of one set of analog capacitance values while a second set of analog capacitance values is being generated. This can enable faster scan rates than approaches like that of FIGS. 17A and 17B, which can execute such actions in series.

Embodiments of the invention can provide sensing performance at lower power consumption and/or smaller device size than approaches like that of FIGS. 17A and 17B. In particular, to achieve fast scan rates, an approach, like that of FIGS. 17A and 17B can employ a high speed ADC circuit, which can require relatively large area and/or power consumption. In contrast, by utilizing a pipelining approach as describe herein (or an equivalent approach), a lower performance ADC can be utilized, which can require smaller area and/or consume less power.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention can be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A capacitance sensing circuit, comprising:
a plurality of sample and hold (S/H) circuits, each configured to sample and store an analog value corresponding to a capacitance sensed by a corresponding sense channel, each S/H circuit comprising a sample amplifier having a first terminal and a sample capacitor having a first terminal and a second terminal, the first terminal of the sample amplifier coupled to the first terminal of the sample capacitor, each S/H circuit further including switch elements, the switch elements configured to couple the first and second terminals of the sample capacitor to a reference voltage in an idle mode, to couple the first terminal to the corresponding sense channel and the second terminal to the reference voltage in a sample mode, to isolate the first terminal and couple the second terminal to the reference voltage in a wait mode, and to couple the first terminal to an amplifier feedback loop and the second terminal to an amplifier input in a hold mode; and a multiplexer (MUX) circuit having a different input coupled to each S/H circuit and an output coupled to an analog-to-digital converter (ADC), wherein the sample amplifier of each S/H circuit is configured to operate in a low power state when an analog voltage from the corresponding sense channel is stored by the corresponding sample capacitor, and configured to operate in a second power state that is higher than the low power state when the S/H circuit is coupled to the ADC.

2. The capacitance sensing circuit of claim 1, wherein:
each sense channel includes a signal amplifier configured to amplify a signal generated with a capacitance sensor.

3. The capacitance sensing circuit of claim 1, wherein:
each sense channel includes a mixer circuit that mixes a periodic reference signal with a capacitance input signal corresponding to the sense channel.

4. The capacitance sensing circuit of claim 1, wherein:
each sense channel includes an integrator circuit configured to integrate a periodic signal generated in response to a sensed capacitance to generate an analog voltage on an integrator output coupled to the corresponding S/H circuit.

5. The capacitance sensing circuit of claim 4, wherein:
each sense channel further includes a mixer circuit having a first mixer input coupled to receive a periodic sense signal, a second mixer input coupled to receive a periodic reference signal, and a mixer output coupled to the corresponding integrator circuit.

6. The capacitance sensing circuit of claim 1, further including:
a digital controller comprising at least one processor coupled to receive digital sensed capacitance values output from the ADC.

7. The capacitance sensing circuit of claim 6, further including:
a capacitance sense array coupled to the sense channels; and
the processor includes an instruction memory that configures the processor to determine a touch occurrence in the sense array in response to the digital sensed capacitance values.

8. A method, comprising:
generating first analog signals from first capacitance sensors corresponding to a plurality of capacitance sense channels;
coupling first and second terminals of a sample capacitor to a reference voltage when a corresponding capacitance sense channel is in an idle mode;
coupling the first terminal of the sample capacitor to the corresponding sense channel and the second terminal of the sample capacitor to the reference voltage when the corresponding capacitance sense channel is in a sample mode;
isolating the first terminal of the sample capacitor and coupling the second terminal of the sample capacitor to the reference voltage when the corresponding capacitance sense channel is in a wait mode;
coupling the first terminal of the sample capacitor to an amplifier feedback loop and the second terminal of the sample capacitor to an amplifier input when the corresponding capacitance sense channel is in a hold mode;
sampling the first analog signals by coupling first terminals of sample capacitors to receive the first analog signals while corresponding amplifiers are in a low power state; and
sequentially converting the first analog signals to digital values while generating second analog signals from second capacitance sensors by sequentially placing the corresponding amplifiers, selected one at a time, into an active power state while maintaining non-selected amplifiers in the low power state.

9. The method of claim 8, further including:
sampling the first analog signals substantially simultaneously;
sampling the second analog signals substantially simultaneously; and
sequentially converting the second analog signals to digital values while generating third analog signals from third capacitance sensors.

10. The method of claim 8, wherein:
generating first analog signals includes
driving one of a plurality of transmit electrodes, and
sensing signals on second electrodes coupled to the transmit electrodes by mutual capacitances.

11. The method of claim 8, wherein:
generating first analog signals includes
amplifying signals generated across first capacitance sensors,
mixing amplified signals with a periodic signal to generate periodic sense signals, and
integrating periodic sense signals to generate the first analog signals.

12. A capacitance sense system, comprising:
a plurality of sense channels, each configured to generate an analog voltage in response to a capacitance sense signal;
a sample and hold (S/H) circuit corresponding to each sense channel, each S/H circuit including switch elements and a sample capacitor having a first terminal and a second terminal, the switch elements configured to couple the first and second terminals of the sample capacitor to a reference voltage in an idle mode, to couple the first terminal to the corresponding sense channel and the second terminal to the reference voltage in a sample mode, to isolate the first terminal and couple the second terminal to the reference voltage in a wait mode, and to couple the first terminal to an amplifier feedback loop and the second terminal to an amplifier input in a hold mode;
a selection circuit configured to sequentially couple the S/H circuits to a same analog-to-digital converter (ADC); and
a controller circuit that compares the digital values output from the ADC to at least one threshold value.

13. The system of claim 12, wherein:
each sense channel comprises an integrator circuit that integrates a capacitance sense input signal to generate the analog voltage.

14. The system of claim 12, wherein:
each S/H circuit further includes an amplifier, each amplifier operating in a low power state when an analog voltage from the corresponding sense channel is stored by the sample capacitor, and operating in a second power state that is higher than the low power state when the S/H circuit is coupled to the ADC.

15. The system of claim 12, wherein each sense channel is coupled to first physical connections of an integrated circuit; and the system further includes:
 a driver circuit that generates a periodic signal for output on second physical connections of the integrated circuit.

16. The system of claim 15, further including:
a capacitance sense array comprising
a plurality of receive electrodes, each coupled to the first physical connections of the integrated circuit, and
a plurality of transmit electrodes, each coupled to the second physical connections of the integrated circuit.

17. The system of claim 16, further including:
a touchscreen comprising the capacitance sense array formed over a display.

* * * * *